United States Patent

Krishnan

[11] Patent Number: 6,117,745
[45] Date of Patent: Sep. 12, 2000

[54] BISTABLE FUSE BY AMORPHIZATION OF POLYSILICON

[75] Inventor: Srikanth Krishnan, Richardson, Tex.

[73] Assignee: Texas Instruments Incorporated, Dallas, Tex.

[21] Appl. No.: 09/148,260

[22] Filed: Sep. 4, 1998

Related U.S. Application Data

[60] Provisional application No. 60/057,964, Sep. 5, 1997.

[51] Int. Cl.⁷ .................................................. H01L 21/20
[52] U.S. Cl. ........................ 438/381; 438/303; 438/380; 438/592; 438/683
[58] Field of Search ..................................... 438/380, 381, 438/382, 383, 586, 592, 683, 707, 710, 14–18, 694, 131; 257/51, 69, 355, 356, 529; 324/158–1, 714, 765, 769

[56] References Cited

U.S. PATENT DOCUMENTS

| | | | |
|---|---|---|---|
| 4,835,118 | 5/1989 | Jones, Jr. et al. | 438/131 |
| 5,702,566 | 12/1997 | Tsui | 438/694 |
| 6,004,871 | 12/1999 | Kittl et al. | 438/529 |
| 6,016,062 | 1/2000 | Nicollian et al. | 324/769 |

Primary Examiner—Tom Thomas
Assistant Examiner—Igwe Anya
Attorney, Agent, or Firm—Mark A. Valetti; Carlton H. Hoel; Frederick J. Telecky, Jr.

[57] ABSTRACT

An embodiment of the instant invention is a method of substantially isolating an electrical device over a semiconductor substrate from a structure which collects charge, the method comprising the steps of: forming an insulating layer (layer 304) on the substrate; forming a conductive layer (layer 306) on the insulating layer; incorporating at least one element (element 310) into portions of the conductive layer so as to render that portion the conductive layer more resistive; and wherein the portion of the conductive layer which has been rendered more resistive (region 312) is rendered conductive after one or more charging events by subjecting the portion of the conductive layer to an elevated temperature. Preferably, the element is comprised of an element selected from the group comprised of: As, P, N, Ar, Si, H, B, Ge, C, Sb, F, Cl, O, any noble element, and any combination thereof and their isotopes. The structure which collects charge is, preferably, a conductive structure (structure 11) which collects charge during plasma processing.

3 Claims, 4 Drawing Sheets

BISTABLE FUSE BY AMORPHIZATION OF POLYSILICON

CROSS-REFERENCE TO RELATED PATENT/PATENT APPLICATIONS

This is a Non Provisional application filed under 35 USC 119(e) and claims priority of prior provisional, Ser. No. 60/057,964 of inventor Srikanth Krishnam, filed Sep. 5, 1997.

The following commonly assigned patent/patent applications are hereby incorporated herein by reference:

| Patent No./Serial No. | Filing Date | TI Case No. |
|---|---|---|
| 08/729,477 | 10/11/97 | TI-21801 |
| 08/728,718 | 10/11/97 | TI-20822 |

FIELD OF THE INVENTION

The instant invention pertains to semiconductor device fabrication, processing, and testing and more specifically to a bistable fuse.

BACKGROUND OF THE INVENTION

Process-induced damage is becoming a very serious concern for semiconductor device manufacturer's. Such damage accounts for device degradations and lower yields. One type of process-induced damage is charge-induced damage. Charge-induced damage can occur during plasma etch and plasma-enhanced deposition processes (collectively referred to as plasma charging damage), ash, and ion implantation. Charge-induced damage is becoming particularly important due to: the scaling down of gate oxide thicknesses and channel length with succeeding technologies; increasing levels of metallization; and the advent of high density plasma sources for etching and deposition.

Charge collection in processes that use photoresist (more specifically, nonconductive photoresist) masking, such as etch processes, may occur along the edge of the antenna pattern or other conductor. However, in processes that do not involve resist (like implantation and deposition), the charge collection may occur over the area of the antenna (or other conductor). Thus, ascertaining whether a charging phenomena is area or perimeter (edge) related would more effectively enable the pinpointing of the process step the charging phenomena occurred in.

In charge-induced damage, the charge collected in the antenna stresses the oxide of a device. More specifically, in a MOSFET structure, the charge collected on the antenna stresses the gate oxide of the MOSFET, thereby inducing stress-related degradation of the MOSFET. This stress-related degradation may include: shortening the lifetime of the device, increasing the gate leakage of the device, or shifting the threshold voltage of the device.

SUMMARY OF THE INVENTION

The testing and protection scheme of the instant invention (collectively referred to as "PREDATOR") can be utilized to detect (and possibly to reduce) charge-induced damage. Such damage can occur during plasma etch, ash, ion implantation, and plasma-enhanced deposition processes. In addition, the novel device of the instant invention can be used to isolate devices so that they may be protected from such charging events and it may be used to selectively isolate devices so that a determination of which process steps cause the most charging damage can be made.

An embodiment of the instant invention is a method of substantially isolating an electrical device over a semiconductor substrate from a structure which collects charge, the method comprising the steps of: forming an insulating layer on the substrate;

forming a conductive layer on the insulating layer; incorporating at least one element into portions of the conductive layer so as to render that portion the conductive layer more resistive; and wherein the portion of the conductive layer which has been rendered more resistive is rendered conductive after one or more charging events by subjecting the portion of the conductive layer to an elevated temperature. Preferably, the element is comprised of an element selected from the group comprised of: As, P, N, Ar, Si, H, B, Ge, C, Sb, F, Cl, O, any noble element, and any combination thereof and their isotopes. The structure which collects charge is, preferably, a conductive structure which collects charge during plasma processing.

BRIEF DESCRIPTION OF THE DRAWINGS

FIGS. 4a–4c illustrate differential pairs for charge-induced damage detection.

FIGS. 5–5c illustrate a method for detecting the polarity of charge causing damage.

FIGS. 6a–6b illustrate a method for post-metal etch damage detection.

DETAILED DESCRIPTION OF THE DRAWINGS

The fuse of the instant invention is a "bi-stable" fuse. This means that the fuse of the instant invention can be formed to be substantially non-conductive (or at least highly resistive) and then rendered substantially conductive and then be rendered substantially non-conductive again. As long as the portion of the conductive (or semiconductive) structure can be implanted into, it can be rendered substantially non-conductive using the method of the instant invention.

Figure 1:
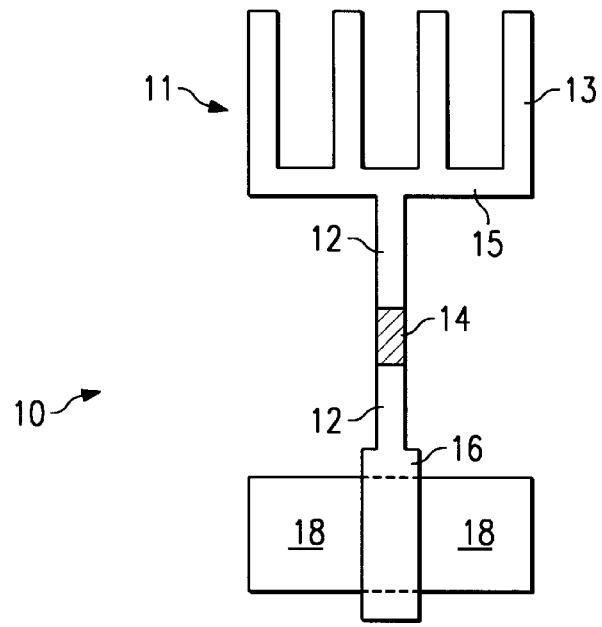
FIG. 1 is plan view of a transistor connected to an "antenna".

FIG. 1 illustrates the novel plasma charging test structure 10. Test structure 10 is comprised of gate region 16 which overlies active region 18. A channel region is preferably situated directly beneath gate region 16. Gate region 16 is connected to the bistable fuse of the instant invention (fuse 14) which is connected to antenna 11 via conductor 12. Preferably, fuse 14 is rendered non-conductive prior to any plasma processing that is not under test so that antenna 11 and gate 16 are electrically isolated from each other during the steps that are not under test. This ability to isolate antenna 11 from gate 16 has added benefits during the testing of transistor 10 for charge-induced damage because it eliminates the effects of the parasitics of antenna 11 from the measurements of transistor 10. In other words, antenna 11 may be very capacitive and such capacitance would create a problem during the testing of transistor 10. In addition, isolating the antenna from the device helps in desensitizing the device from any subsequent process-induced damage.

The purpose of antenna 11 is to receive charge during a process step. After the charge is received for a given process step or a series of process steps, antenna 11 may be electrically isolated from gate 16 and gate 16 may be tested so as to determine the extent of the damage to the transistor due to the charging of the transistor from the process step or steps. Antenna 11 may be fabricated in any shape. In fact, antenna 11 is illustrated in FIG. 1 with fingers 13 and a body 15.

While the shape of the antenna may not be critical, the antenna ratio (which is the ratio of the area of the charge-collecting electrode to the active area of the transistor) and the perimeter ratio (which is the ratio of the perimeter of the antenna to the active area of the transistor) of the antennas are important. As the perimeter of the antenna gets longer the "edge effect" with regards to charging becomes more pronounced, and as the antenna ratio becomes larger the "area effect" becomes more pronounced. Hence, as either or both of these ratio's become large, the amount of charge collection increases and such scaling of the transistor degradation with increasing ratio is proof of charge-induced damage. The antenna ratio of an antenna can be anywhere from 10 to 200,000 and the perimeter of antenna 11 can be from 5 to 500,000 nm.

Utilizing an array of active devices connected to antennas in a testing fashion, it is important to systematically vary the antenna ratio while holding the perimeter ratio constant and to systematically vary the perimeter ratio while holding the antenna ratio constant so that the edge effect and the area effect can be systematically derived The antenna of FIG. 1 is shaped like a fork. This type of configuration allows for an increased perimeter of the antenna without substantially increasing the area of the antenna. In addition, the pitch of the antenna fingers may be varied so as to capture pattern dependent charging effects. Therefore, as was stated above, the shape of antenna 11 can be rectangular, circular, or any other geometric shape.

Figure 2:
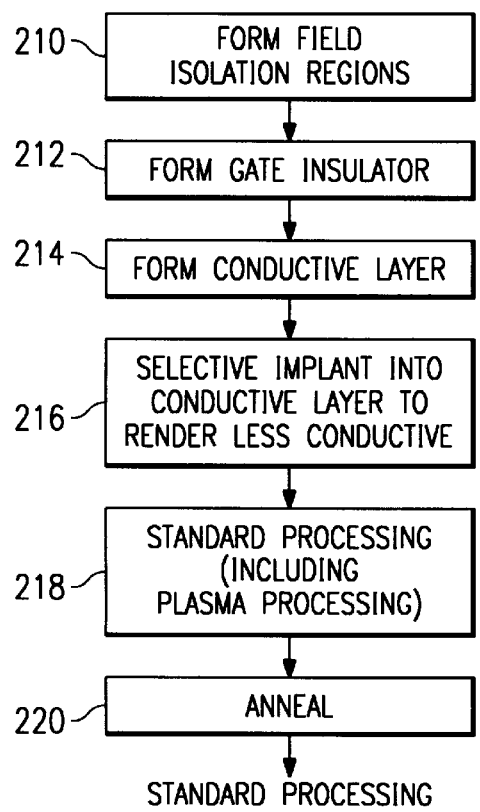
FIG. 2 is a flow diagram illustrating the method of the instant invention.
Figure 3A:
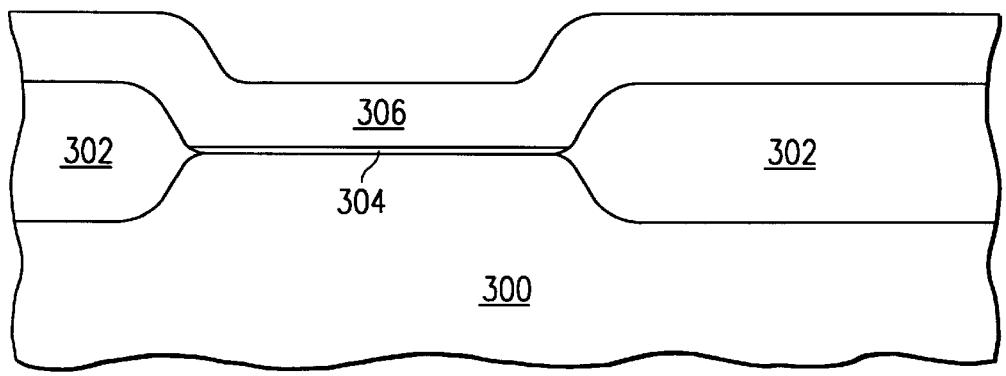
FIGS. 3a–3c are plan views illustrating the method of the instant invention for fabricating the bistable fuse of the instant invention.
Figure 3B:
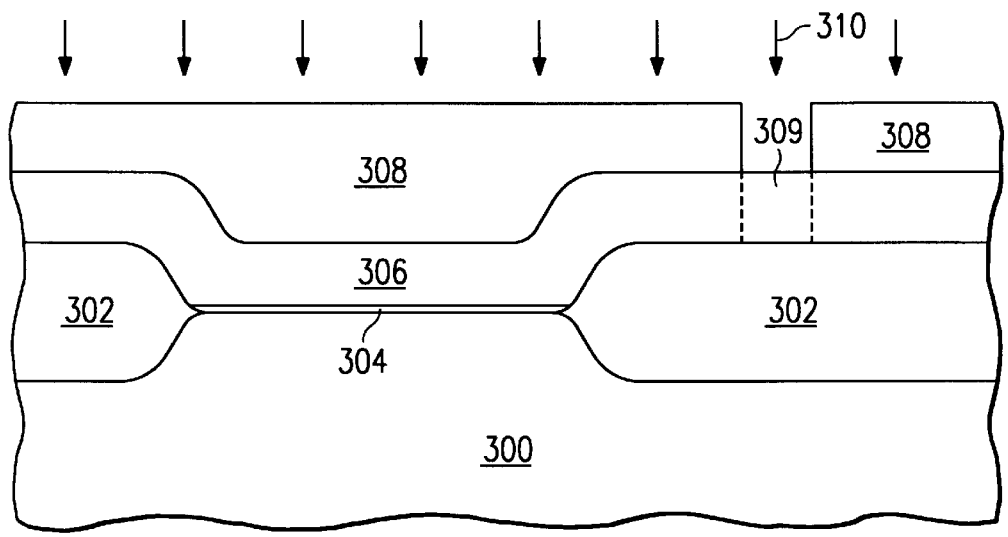
Figure 3C:
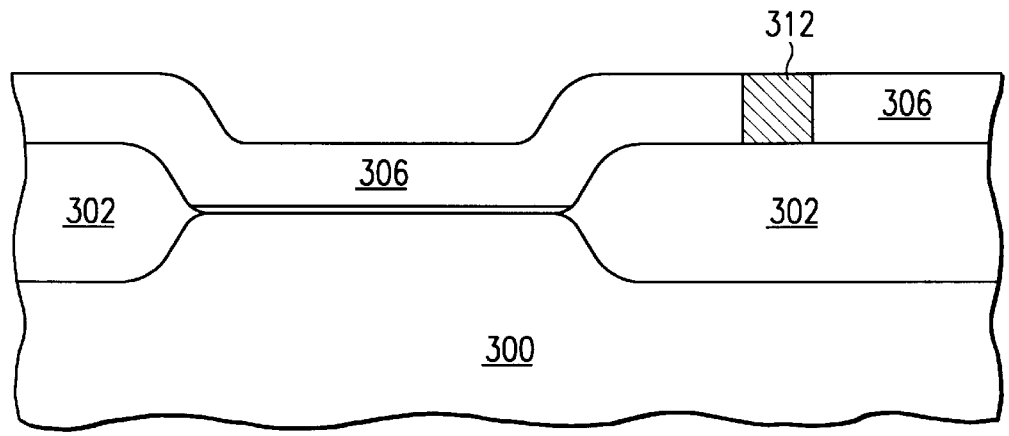

Referring to the novel process flow of the instant invention as depicted in FIG. 2 and the cross-sectional device diagrams of FIGS. 3a–3c, after substrate 300 is provided and cleaned field isolation regions 302 are formed in step 210. Field isolation regions 302 are depicted in FIGS. 3a–3c as field oxidation regions, but they may be any type of isolation regions (such as trench isolation regions). Thin insulating region 304 is formed in step 212 which may be performed before or after step 210. Preferably, insulating region 304 is comprised of oxide (preferably on the order of 10 to 60 angstrom of a thermally grown oxide), an oxynitride, an oxide-nitride stack, or a nitride. Next, conductive (or semiconductive) layer 306 is formed in step 214. Preferably, layer 306 is comprised of polysilicon (preferably doped with boron or phosphorous to render it more conductive). Layer 306 is preferably deposited using CVD and is doped insitu or is implanted after layer 306 is formed.

Mask 308 is formed such that only a portion of conductive layer 306 is exposed. This is followed by an implant step whereby at least one element is implanted in exposed portion 309 so as to render that portion of conductive layer 306 substantially nonconductive (or at least highly resistive—preferably on the order of at least eight to ten times more resistive). Preferably, exposed portion 309 is implanted with As, P, N, Ar, Si, H, B, Ge, C, Sb, O, Mo, or any noble element other than Rn. The implant dosage is preferably on the order of $1 \times 10^{13}$ to $1 \times 10^{14}$ cm-2.

Next, standard semiconductor processing is performed in step 218. This will, most likely, include many different steps. One of the steps involves a plasma etch step to pattern the polysilicon layer. The transistor connected to the fuse should remain unharmed because the fuse should remain relatively nonconductive. The fuse can be rendered conductive by subjecting the wafer to a furnace anneal, rapid thermal anneal or some other thermal treatment, or it can be rendered conductive by a laser anneal. After rendering the fuse conductive, any plasma charging of the antenna will affect the transistor.

The fuse of the instant invention can be repeatedly rendered conductive/nonconductive as long as there is an opening in which to implant into the polysilicon layer. Furthermore, the antenna structure may be comprised of a metal or a silicide. The connection to conductive layer 306 can be made by a via or an interconnect.

In another embodiment of the instant invention, the fuse of the instant invention can be used to protect a device rather than merely isolating it from the charging for a few processing steps so as to determine the critical charging processes. Hence, the fuse of the instant invention can be used both as a protection device and as a test structure device.

This type of "fuse" has several advantages over conventional methods. First, many of these circuit elements can be rendered non-conductive or at least highly resistive at one time. This can be accomplished (where the circuit element is fabricated from polysilicon) by using a patterning step followed by a blanket implant step. Second, this type of "fuse" does not require a laser or an electrical pulse to render the "fuse" non-conductive. Conventional methods typically use either lasers or an electrical pulse, which can damage other circuit elements that are also subjected to such energy or could damage other circuit elements by leaving debris behind (thereby resulting in a leakage path). Third, the resistance across the "fuse" can be controlled. This becomes particularly important in applications such as that of FIG. 1 because very low resistances are required. Fourth, there are no restrictions on the number of these types of "fuses" that can be utilized because throughput is not affected by extensive use of this type of "fuse".

As was discussed above, the fuse of the instant invention can be utilized in the structure of FIG. 1 so as to selectively isolate the antenna from the transistor. In addition, the fuse of the instant invention can be utilized in other ways. It can be used to protect a circuit element during a process step from charge-induced damage, and later be rendered non-conductive so as not to affect circuit performance. In addition, it can be utilized to protect a circuit element from one process step while not protecting it from another so that the affect of only one process can be studied. In other words, the "fuses" of the instant invention may be made non-conductive at various device levels while keeping other fuses conductive. This can be accomplished by using different masks at these various device levels so as to render some or all of the "fuses" non-conductive. Also note that the "fuses" of the instant invention can be fabricated from virtually any semiconductive material.

Figure 5:
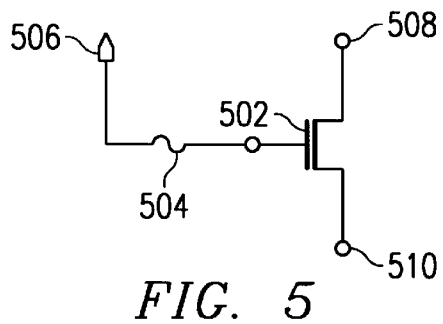
FIGS. 5–5c are circuit diagrams of another embodiment of the instant invention.
Figure 5A:
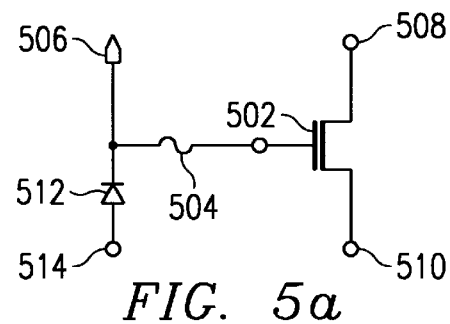
Figure 5B:
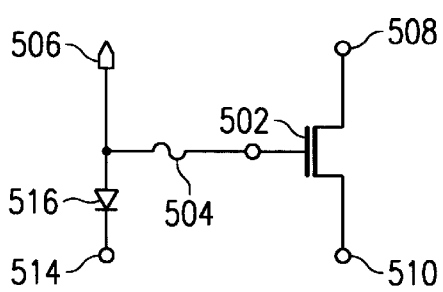
Figure 5C:
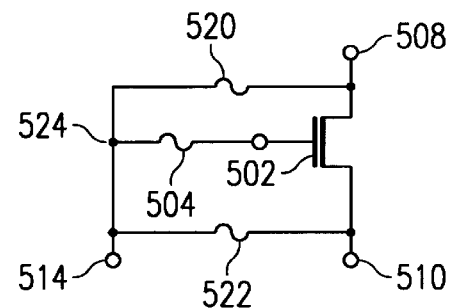

Referring to FIGS. 5–5c, the circuit of FIG. 5 simply illustrates transistor 502 which is subjected to charge-induced damage via antenna 506 and "fuse" 504. "Fuse" 504 can be rendered non-conductive after one, several, or all of the process steps such that the amount of charge-induced damage can be limited to one, several, or all of the "charged" process steps. During testing, supply voltages are applied to terminals 508 and 510. The circuit of FIG. 5c is a control circuit which has fuses 520 and 522 connected between node 524 and the two source/drain regions of transistor 502. Transistor 502 of FIG. 5c should be subjected to minimal charge-induced damage due to the fact that the gate of transistor 502 is tied to the substrate via node 514 and "fuse" 504. The control circuit of FIG. 5c can be compared to the circuits of FIGS. 5–5b so as to determine the extent of charge-induced damage to each of these circuits.

The circuits of FIGS. 5a and 5b are similar to the circuit of FIG. 5 except for the placement of diodes 512 and 516. The circuit of FIG. 5a represents a negative charge shunt while the circuit of FIG. 5b represents a positive charge shunt. In other words, the circuits of FIGS. 5a and 5b can be utilized to determine the polarity of the charges that damage transistor 502. In addition, diodes 512 and 516 may be comprised of a series of diodes so as to increase the reverse bias breakdown voltage. Furthermore, diodes 512 and 516 may be shielded from any in-process illumination and compared to circuits with diodes without such illumination.

As was discussed above, "fuse" 504 can be rendered non-conductive for different reasons. First, it can be rendered non-conductive so as to isolate transistor 502 from antenna 506 so as to greatly reduce the amount of charge damage that transistor 502 is experienced to in subsequent process steps. Second, it can be rendered non-conductive so as to isolate transistor 502 from the parasitics of antenna 506 or node 514 so as to facilitate testing of transistor 502.

Figure 6A:
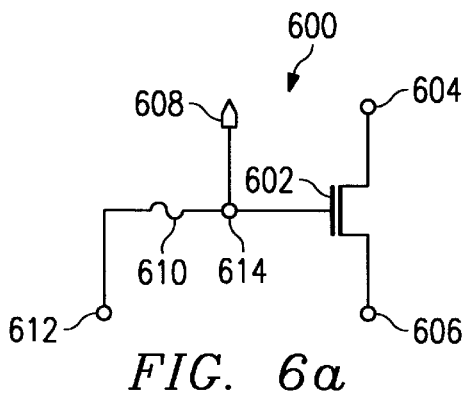
FIGS. 6a–6b are circuit diagrams of another embodiment of the instant invention.
Figure 6B:
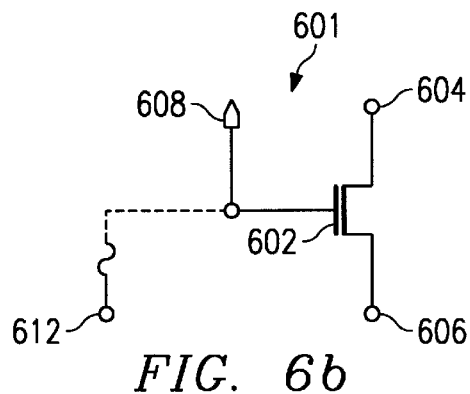

The circuits of FIGS. 6a and 6b represent another embodiment of the instant invention. Circuit 600 is comprised of transistor 602 which has a gate that is connected to antenna 608 and to the substrate (via "fuse" 610). As long as "fuse" 610 remains conductive, transistor 602 of circuit 600 should experience minimal charge-induced damage. However, once "fuse" 610 is rendered non-conductive (as is illustrated by circuit 601 in FIG. 6b), transistor 602 will be subjected to the charges collected by antenna 608. The ability to protect transistor 602 (as is done in circuit 600) and then to allow transistor 602 to be subjected to charge-induced damage after one or more process steps facilitates in determining the extent to which devices are damaged in subsequent process steps, such as post-metal etch. In addition, a "fuse" may be placed between node 614 and antenna 608 such that "fuse" 610 may be rendered non-conductive (resulting in subjecting transistor 602 to charge-induced damage) after one or more process steps and then rendering the "fuse" between node 614 and antenna 608 non-conductive thereby reducing the amount of charging of transistor 602 so that the amount of charging damage can be determined for middle level process steps. Total elimination of the effects of any further processing is possible by the addition of a fuse following the middle level process steps.

Figure 4A:
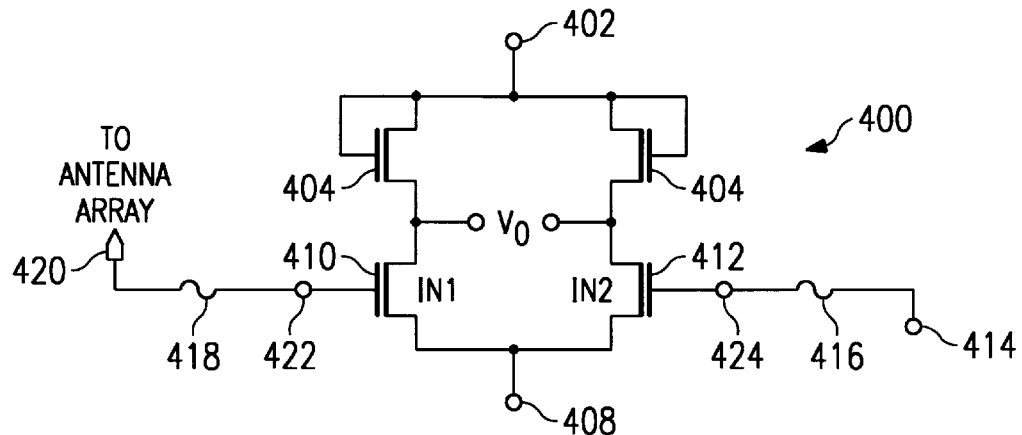
FIGS. 4a–4c are circuit diagrams illustrating a third embodiment of the instant invention.
Figure 4B:
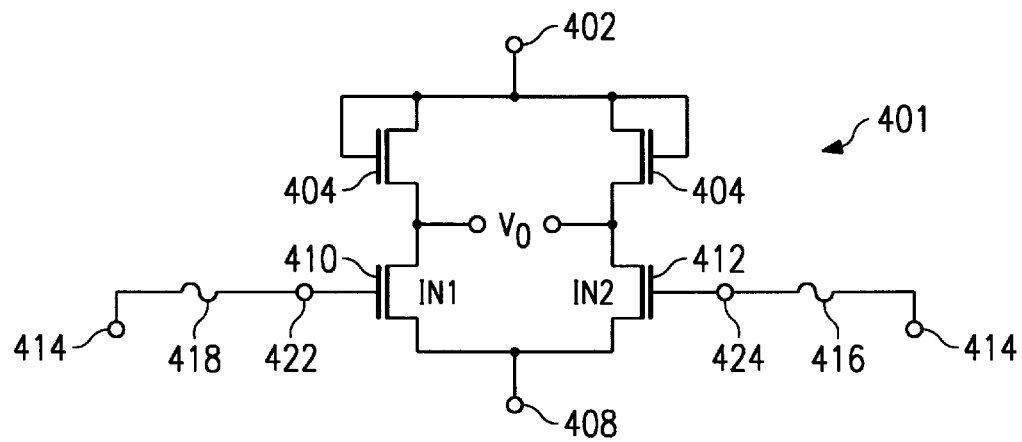
Figure 4C:
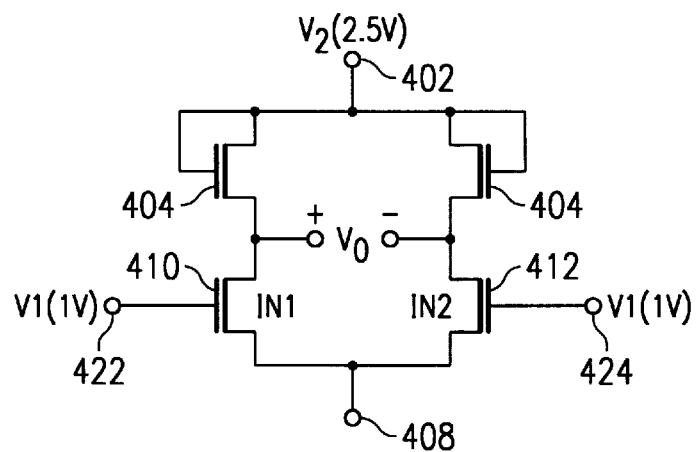

FIGS. 4a–4c illustrate another embodiment of the instant invention. The circuits of FIGS. 4a–4c utilize the antenna from the first embodiment and the "fuse" of the second embodiment. However, these circuits can be utilized to determine the extent of the charge-induced damage that occurs at various process steps. The circuits of FIGS. 4a–4c are differential amplifiers with similarly numbered elements being the same. Supply voltages are applied to nodes 402 and 408, and nodes 414 are preferably connected to the substrate (which is preferably grounded). Transistors 404 provide the appropriate biasing.

The circuit of FIG. 4a is utilized to determine the extent of charge-induced damage that can occur to a transistor (transistor 410). In order to accomplish this, "fuse" 418 remains conductive while the devices are processed. "Fuse" 418 may remain conductive for the entire fabrication of device 400 or it can be rendered non-conductive after one or more process steps, thereby isolating damaged caused to transistor 410 to the charge induced damage occurring in those steps prior to "fuse" 418 being rendered non-conductive. Transistor 410 will become degraded due to the charge-induced damage because of the charges collected on antenna 420 as was described above. Antenna 420 can be of any shape.

Since transistor 412 is connected to the substrate via conductive "fuse" 416, transistor 412 should not become damaged other then typical fabrication defects and the slight charge-induced defects that occur due to the limited exposure of the device. The difference in transistors 410 and 412 resulting from the different exposure to the charges of the process steps will result in a non-zero value for Vo. Now referring to FIGS. 4a and 4c, in order to make this measurement, both fuses 418 and 424 are rendered non-conductive and voltages VI are applied at nodes 422 and 424. Since there will be different electrical characteristics for transistors 410 and 412 due to the different exposure to charge-induced damage, a non-zero voltage will arise at Vo. This non-zero Vo value represents the extent to which transistor 410 has been damaged as compared to transistor 412. The greater the value for Vo, the greater the difference between transistor 410 and 412.

Now referring to FIGS. 4b and 4c, in order to determine the amount of damage to transistor 410 of FIG. 4a due to charge-induced damage as compared to transistor 412, control circuit 401 is utilized. Control circuit 401 is included on the same wafer as circuit 400, but both transistor 410 and 412 are electrically connected to the substrate in circuit 401. Therefore, both transistor 410 and 412 should be subjected to the same amount of charge-induced damage. Hence, any non-zero value for V0 will be the result of the standard processing defects and not necessarily due to the charge-induced defects. The Vo value of circuit 401 can be compared to that for circuit 400 so as to determine the extent of the Vo value for circuit 400 that can be attributed to charge-induced damage, and, hence, the extent of damage to transistor 410 of FIG. 4a that can be attributed to the charge-induced defects.

The measurement of Vo for circuit 401 can be accomplished by rendering "fuses" 418 and 416 of circuit 401 non-conductive after the fabrication of circuit 401. After the fuses are rendered non-conductive, voltages, V1 and V2, can be applied to terminals 402, 422 and 424 and Vo can be measured.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What is claimed is:

1. A method of substantially isolating an electrical device over a semiconductor substrate from a structure which collects charge, said method comprising the steps of:

forming an insulating layer on said substrate;

forming a conductive layer on said insulating layer;

incorporating at least one element into portions of said conductive layer so as to render that portion of said conductive layer more resistive; and wherein said portion of said conductive layer which has been rendered more resistive is rendered conductive after one or more charging events by subjecting said portion of said conductive layer to an elevated temperature.

2. The method of claim 1, wherein said at least one element is comprised of an element selected from the group comprised of: As, P, N, Ar, Si, H, B, Ge, C, Sb, F, Cl, O, any noble element, and any combination thereof and their isotopes.

3. The method of claim 1, wherein said structure which collects charge is a conductive structure which collects charge during plasma processing.

* * * * *